US008693207B2

(12) United States Patent
Yang et al.

(10) Patent No.: US 8,693,207 B2
(45) Date of Patent: Apr. 8, 2014

(54) ROTATABLE TRANSFER APPARATUS WITH ELASTIC MODULE

(75) Inventors: Xin Yang, Shenzhen (CN); Wei Wu, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 206 days.

(21) Appl. No.: 13/249,262

(22) Filed: Sep. 30, 2011

(65) Prior Publication Data

US 2012/0147574 A1 Jun. 14, 2012

(30) Foreign Application Priority Data

Dec. 14, 2010 (CN) .......................... 2010 1 0587322

(51) Int. Cl.
*H05K 5/00* (2006.01)

(52) U.S. Cl.
USPC ........................................... 361/755; 361/752

(58) Field of Classification Search
CPC ....................................................... H01R 27/00
USPC .......... 361/755, 737, 730, 736, 752; 439/131, 439/946, 76.1, 945
See application file for complete search history.

(56) References Cited

U.S. PATENT DOCUMENTS

| | | | | |
|---|---|---|---|---|
| 6,676,420 | B1 * | 1/2004 | Liu et al. | 439/131 |
| 7,031,759 | B2 * | 4/2006 | Wong et al. | 455/575.1 |
| 7,522,424 | B2 * | 4/2009 | Mambakkan et al. | 361/737 |
| 2009/0029576 | A1 * | 1/2009 | Shunjie | 439/131 |
| 2010/0210119 | A1 * | 8/2010 | Bauer et al. | 439/13 |

* cited by examiner

*Primary Examiner* — Yuriy Semenenko
(74) *Attorney, Agent, or Firm* — Altis Law Group, Inc.

(57) ABSTRACT

A rotatable transfer apparatus includes a housing and a circuit board having at least two interfaces. The housing includes a top cover, a sidewall, a bottom board and an elastic module. The top cover is rotatably mounted at one side of the sidewall. The bottom board is mounted at the other side of the sidewall opposite to the top cover. The sidewall, the bottom board and the top cover define a receiving space for receiving the circuit board. The sidewall includes an opening, and at least two fasteners defined in an internal surface of the sidewall. The elastic module is received in the receiving space and fixed to the top cover. The elastic module rotates with the top cover and detachably engaged with one of the at least two fasteners to select a desired interface to be exposed to the opening.

6 Claims, 10 Drawing Sheets

ROTATABLE TRANSFER APPARATUS WITH ELASTIC MODULE

BACKGROUND

1. Technical Field

The present disclosure relates to transfer apparatus, and more particularly, to a rotatable transfer apparatus with a plurality of interfaces to connect to electronic devices.

2. Description of Related Art

A transfer apparatus generally includes a plurality of interfaces, such as a universal serial bus (USB), and a video graphics array (VGA), for example. The plurality of interfaces of the transfer apparatus are normally located about different positions of the transfer apparatus. A user needs to select one of the interfaces each time in order to transfer different data signals. However, the different positions are inconvenient for the user to find a desired interfaces.

Although some transfer apparatus have been designed to have a rotatable mechanism used for selecting the interfaces, when the rotatable mechanism is rotated, the friction resulted in the rotatable mechanism may easily result in serious abrasion to a fixing unit of the rotatable mechanism. Accordingly, if the transfer apparatus is used many times, the fixing unit may become abraded, and a lifetime of the transfer apparatus may be shortened.

What is needed, therefore, is a transfer apparatus which can overcome the described limitations.

SUMMARY OF INVENTION

It is therefore a rotatable transfer apparatus of the claimed invention to provide a top cover of the rotatable transfer apparatus. The top cover is rotated to select a desired interface in order to solve the above-mentioned problems.

According to the claimed invention, the rotatable transfer apparatus includes a housing and a circuit board having at least two interfaces. The housing includes a top cover, a sidewall, a bottom board and an elastic module. The top cover is rotatably mounted at one side of the sidewall. The bottom board is mounted at the other side of the sidewall opposite to the top cover. The sidewall, the bottom board and the top cover define a receiving space for receiving the circuit board. The sidewall includes an opening, and at least two fasteners defined in an internal surface of the sidewall. The elastic module is received in the receiving space and fixed to the top cover. The elastic module rotates with the top cover and detachably engaged with one of the at least two fasteners to select a desired interface to be exposed to the opening.

It is an advantage of the claimed invention that the rotatable transfer apparatus can control the elastic module to rotate with the top cover and detachably engaged with one of the at least two fasteners to select a desired interface. Therefore, a user can rotate the top cover to select a desired interface and it is convenient for the user.

These and other objectives of the claimed invention will no doubt become obvious to those of ordinary skill in the art after reading the following detailed description of the preferred embodiment, which is illustrated in the various figures and drawings.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the various views, and all the views are schematic.

DETAILED DESCRIPTION

Reference will now be made to the drawings to describe specific exemplary embodiments of the present disclosure in detail.

Figure 1:
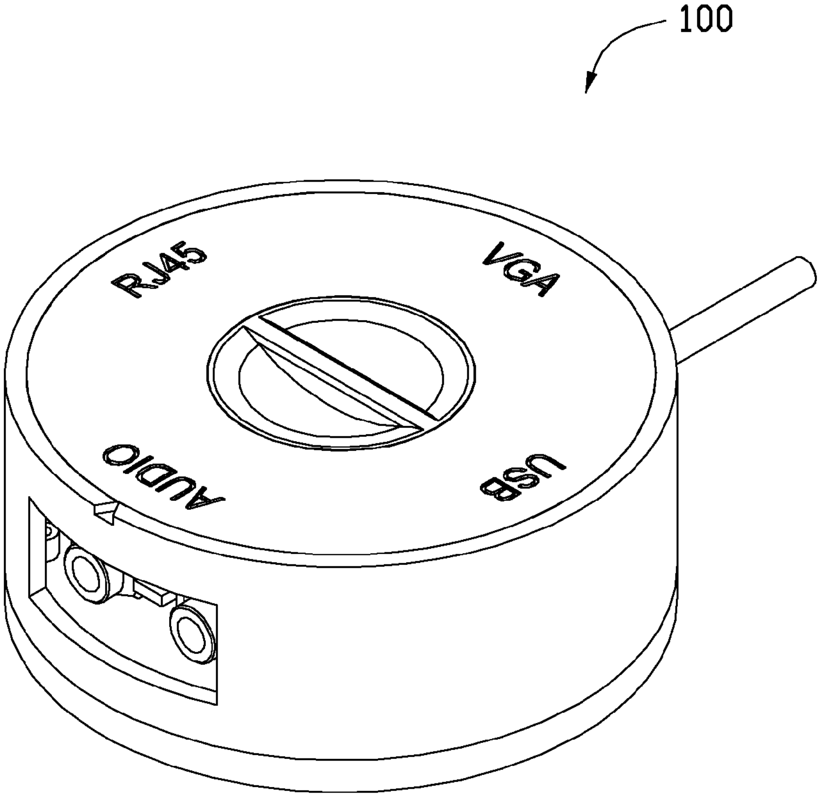
FIG. 1 is an isometric view of a transfer apparatus according to one embodiment of the present disclosure.
Figure 2:
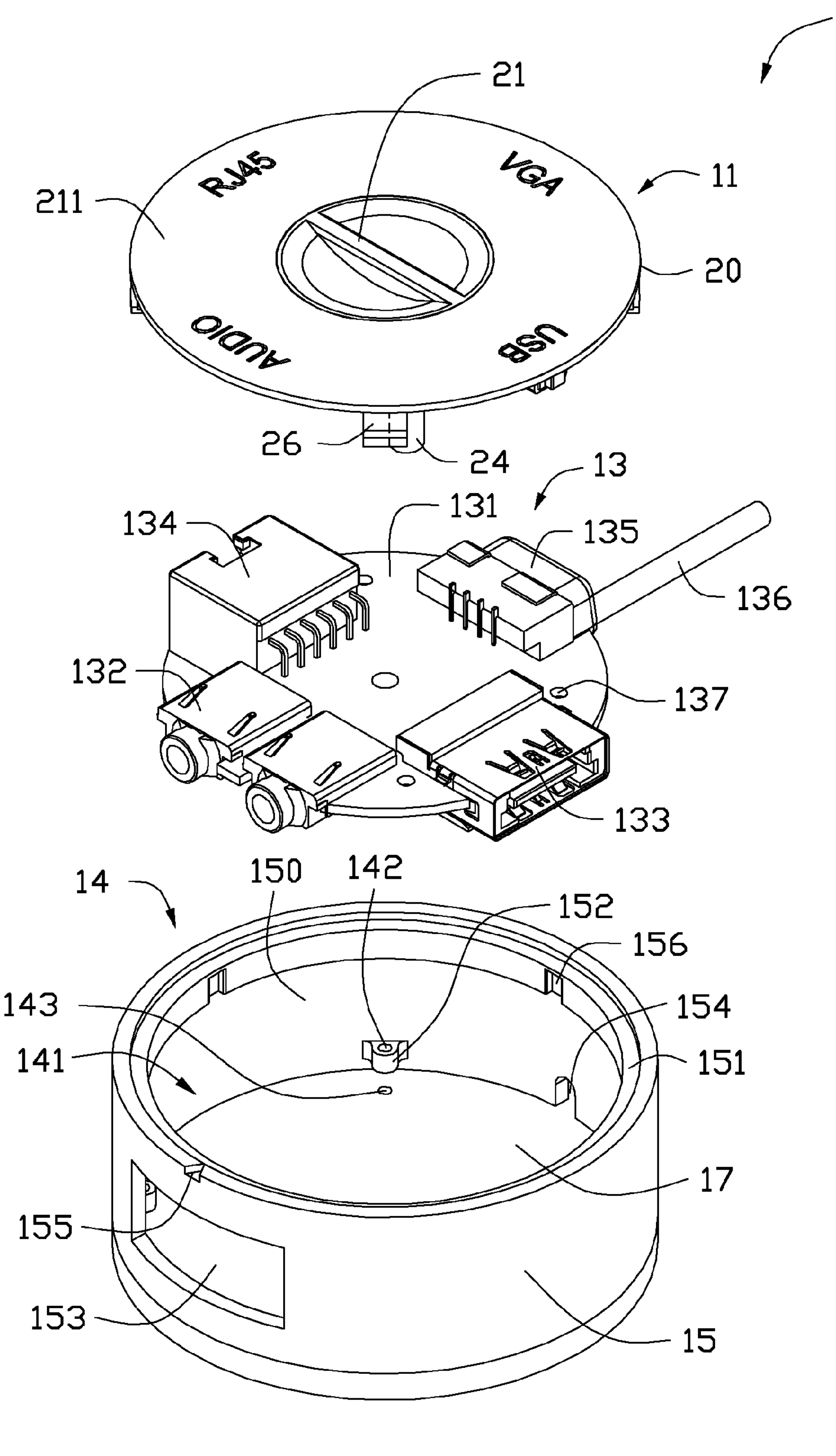
FIG. 2 is an exploded, isometric view of the transfer apparatus of FIG. 1, the transfer apparatus including a top cover, a circuit board with a plurality of interfaces, and a main body including a sidewall.

Referring to FIGS. 1-2, a transfer apparatus 100 includes a top cover 11, a circuit board 13, and a main body 14. The top cover 11 cooperates with the main body 14 to define a housing 141. The circuit board 13 is received in the housing 141 and mounted to the top cover 11. The main body 14 includes a cylindrical sidewall 15 and a circular bottom board 17 detachably connected with the cylindrical sidewall 15.

Figure 3:
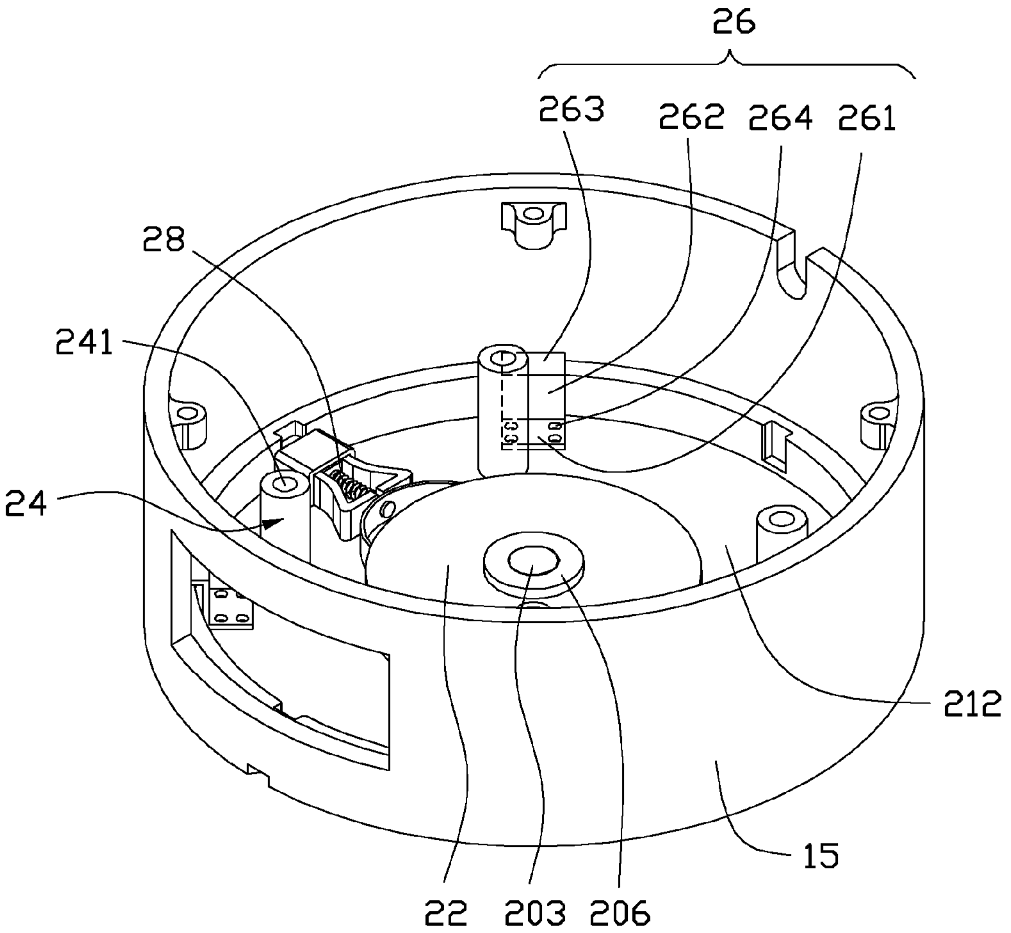
FIG. 3 is an isometric view of the main body and the top cover of FIG. 2 with the top cover assembled with the sidewall in an opposite view angle to FIG. 2, the top cover including an elastic module.
Figure 4:
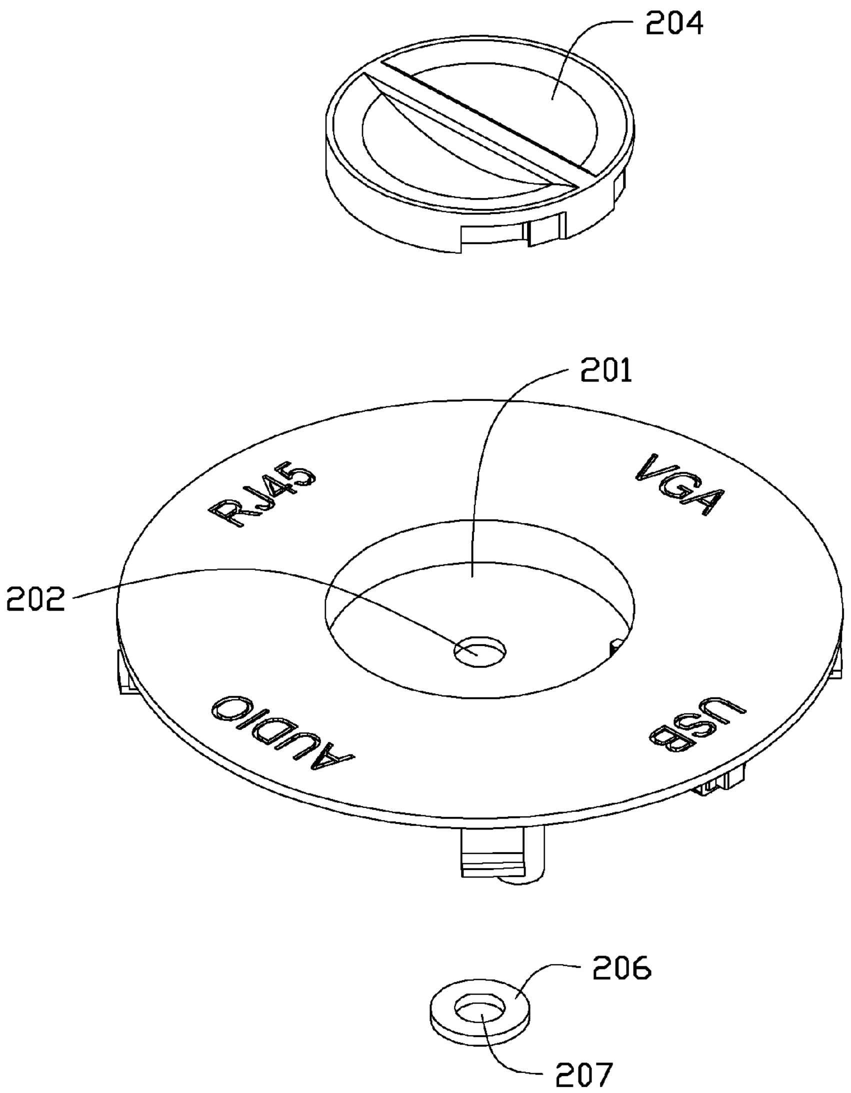
FIG. 4 is an exploded, isometric view of the top cover of FIG. 2.

Referring also to FIG. 3, the top cover 11 includes a top board 20, a rotatable knob 21, a nut 206, a protrusion 22 extending from the center of an inner surface 212 of the top board 20 as shown in FIG. 3, four column posts 24, four angle brackets 26 and an elastic module 28. The rotatable knob 21 is rotatably formed at the center of the top board 20 opposite to the protrusion 22. Labels, such as AUDIO, USB, RJ-45 and VGA, are labeled on the periphery of an outer surface 211 oft the top cover 11 as shown in FIG. 2. In detail, referring also to FIG. 4, the top board 20 includes a concavity 201 located in its center corresponding to the protrusion 22. A hole 202 is defined in the concavity 201 to pass through the protrusion 22. The rotatable knob 21 includes a button 204 as shown in FIG. 4 and a screw pole 203 as shown in FIG. 2. The button 204 is formed at an end of the screw pole 203 and received in the concavity 201. The screw pole 203 of the rotatable knob 21 passes through the hole 202 to engage with the nut 206 to rotatably fix the top board 20 with the button 204. The column posts 24 are positioned on the inner surface 212 of the top board 20 to surround the protrusion 22. Each column post 24 defines a thread hole 241 in the column post 24.

Figure 5:
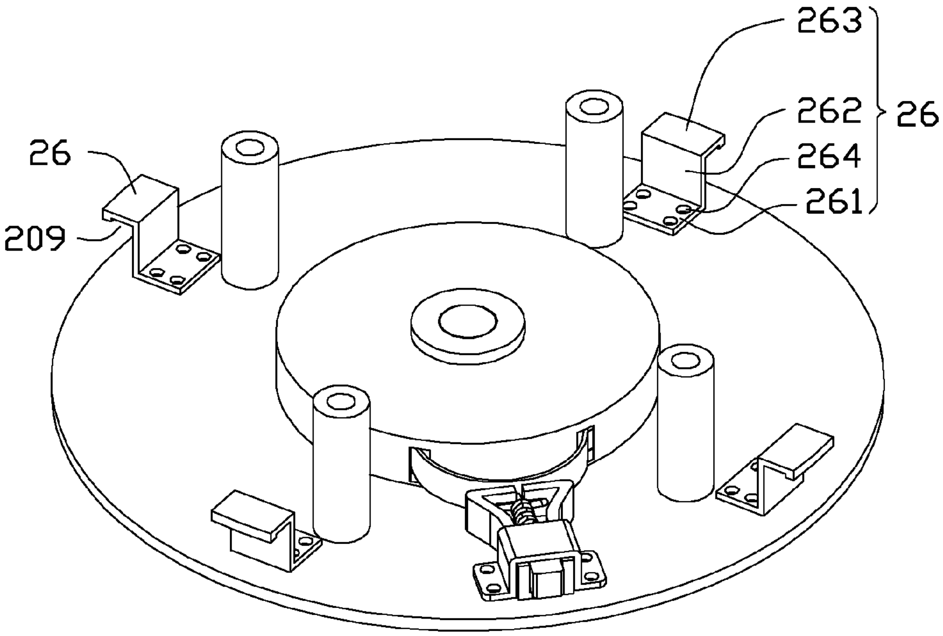
FIG. 5 is an isometric view of the top cover of FIG. 2 in an opposite view angle to FIG. 2.

Referring also to FIG. 5, the angle brackets 26 are located at a peripheral area of the inner surface 212 of the top board 20. Each angle bracket 26 includes a first portion 261, a second portion 262 perpendicularly extending from an end of the first portion 261, and a third portion 263 perpendicularly extending from a free end of the second portion 262 and extending towards an edge of the top board 20. The first and third portions 261, 263 are parallel to each other and oppositely extending from two ends of the second portion 262. The first portion 261 defines four through holes 264. The top board 20 further defines a plurality of fixing holes (not shown) corresponding to the through holes 264. The first portions 261 of the angle brackets 26 are fixed to the top board 20 by a plurality of fasteners (e.g., bolts, not shown) each passing through the through hole 264 of the first portion 261 and threading into the fixing holes of the top board 20. The second and third portions 262, 263 and the peripheral area of the inner surface 212 of the top board 20 define a receiving space 209 as shown in FIG. 5.

Figure 6:
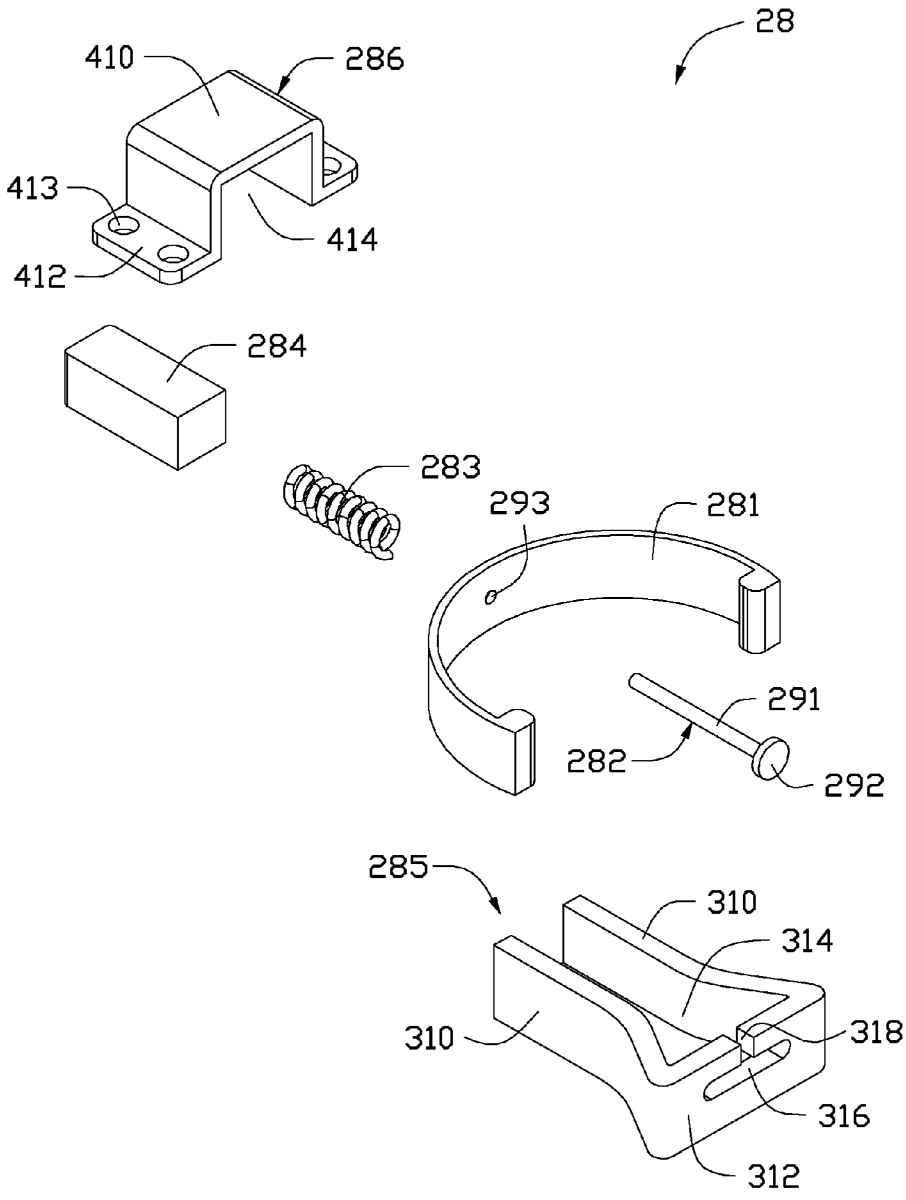
FIG. 6 is an exploded, isometric view of the elastic module of FIG. 3.
Figure 7:
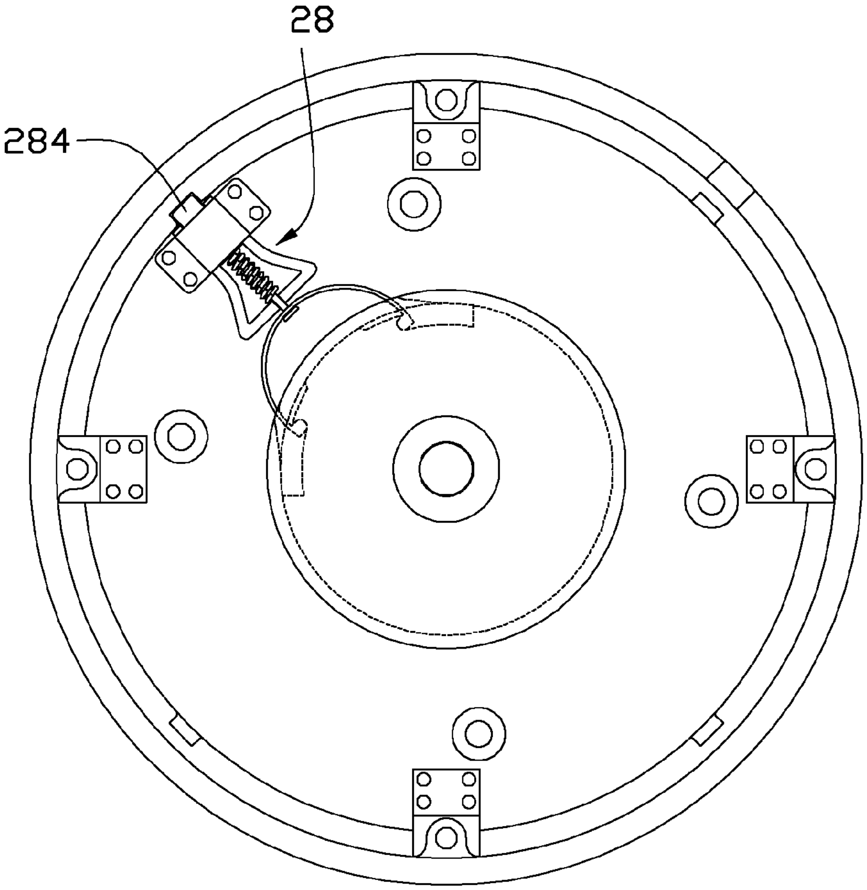
FIGS. 7-10 are bottom views of the top cover of FIG. 3, showing operating states of the elastic module.
Figure 8:
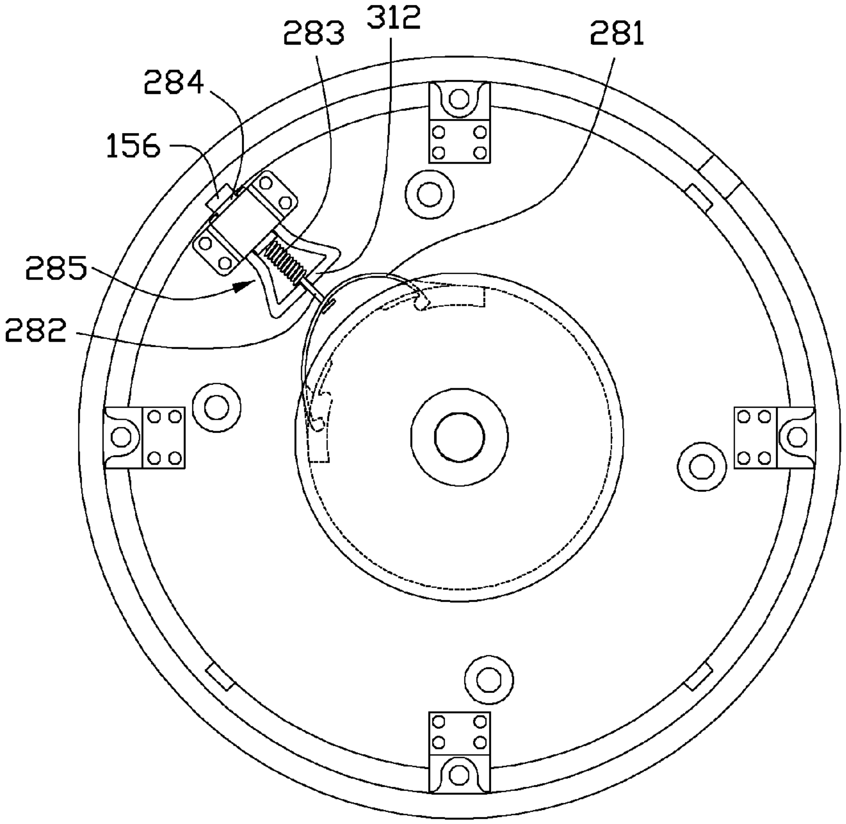

Referring to FIG. 6, the elastic module 28 includes a transformable element 281, a connecting element 282, an elastic element 283, a position block 284, a receiving element 285 and a position-limiting element 286. The connecting element 282 includes a connecting block 292 and a connecting pole 291 extending from the connecting block 292. In this embodiment, the transformable element 281 can be semicircle-shaped or arc-shaped and a bore 293 is defined in the middle of the transformable element 281. The receiving element 285 includes two supporting portions 310 and a receiving portion 312. The supporting and the receiving portions 310, 312 perpendicularly extend from the inner surface 212 of the top board 20. The supporting portions 310 connect to two opposite ends of the receiving portion 312 respectively, thereby forming a substantially U-shaped structure and defining a receiving groove 314 with an opening towards the sidewall 15. The receiving portion 312 includes a bar-shaped sliding groove 316 defined thereof and a gap 318 defined at the middle communicating with the sliding groove 316. The position-limiting element 286 includes an arch-shaped portion 410 and two horizontal portions 412 extending from two free ends of the arch-shaped portion 410. The arch-shaped portion 410 defines a sliding hole 414. The horizontal portion 412 each defines two through holes 413. The top cover 11 further defines four screw hole (not show) in the inner surface 212 of the top board 20 corresponding to the through holes 413. The elastic element 283 may, for example, be a spring.

In assembly, first, the connecting pole 291 passes through the bore 293 of the transformable element 281 and the elastic element 283. The connecting pole 291 and the connecting block 292 are located at two opposite sides of the transformable element 281. The connecting block 292 can not pass through the bore 293 of the transformable element 281. Secondly, a free end of the connecting pole 291 is connected to the position block 284 via a welding technology, for example. Accordingly, the position block 284 connects to the transformable element 281 via the connecting element 282 with the elastic element 283 sleeved over the connecting element 282. Thirdly, two ends of the transformable element 281 are fixed to a side surface of the protrusion 22 as shown in FIG. 5. Fourthly, an end of the connecting pole 291 adjacent to the transformable element 281 slides into the sliding groove 316 via the gap 318. The elastic element 283, most of the connecting pole 291 and the position block 284 are received in the receiving groove 314. Fifthly, the position-limiting element 286 is fixed to the inner surface 212 of the top board 20 by a plurality of fasteners (e.g., bolts, not shown) which passes through the through holes 413 and are threaded into screws hole of the top board 20. The position block 284 is received in the slide hole 414 of the position-limiting element 286 and capable of sliding along the receiving groove 314.

Referring to FIG. 2 again, the circuit board 13 includes a printed circuit board (PCB) 131, an AUDIO interface 132, a USB interface 133, a RJ-45 interface 134, a VGA interface 135 and a data line 136. The AUDIO interface 132, the USB interface 133, the RJ-45 interface 134 and the VGA interface 135 are fixed to the PCB 131 and electrically connected to the PCB 131, thereby aligning to the labels AUDIO, USB, RJ-45 and VGA, correspondingly. The data line 136 is electrically connected to the PCB 131 and adjacent to the bottom board 17. The AUDIO interface 132, the USB interface 133, the RJ-45 interface 134, and the VGA interface 135 are configured to connect to a first electronic device (not shown), such as a host computer. The data line 136 is configured to connect to a second electronic device, such as a portable hard disk (not shown). Accordingly, data of the first electronic device is capable of transmitting to the second electronic device via the circuit board 13. Furthermore, four through holes 137 are defined in the PCB 131 corresponding to the four column posts 24 of the top board 20.

An annular protrusion 151 extends from an internal surface 150 of the sidewall 15 adjacent to the top board 20. At least two fasteners 156 are defined in the annular protrusion 151 and configured to contain part of the position block 284. In the embodiment, each of the at least two fasteners 156 is a recess and the number of the at least two fasteners is four. Four locking elements 152 each with a lockhole 142 are positioned on the internal surface 150 of the sidewall 15 adjacent to the bottom board 17. The sidewall 15 includes a first opening 153 and a second opening 154. The first opening 153 is configured as a square window in the middle of the sidewall 15 for exposing one desired interface selected from the AUDIO interface 132, the USB interface 133, the RJ-45 interface 134, and the VGA interface 135. The second opening 154 is a through hole adjacent to the bottom board 17. A mark groove 155 is defined at a top surface of the sidewall 15 adjacent to the top cover 11 above the first opening 153. The mark groove 155 is configured for marking whether one desired interface selected from the AUDIO interface 132, the USB interface 133, the RJ-45 interface 134, and the VGA interface 135 is rotated to align with the first opening 153. The bottom board 17 includes four mounting holes 143 corresponding to the four lockholes 142 of the locking elements 152.

An assembly process of the transfer apparatus 100 is as follows.

First, the sidewall 15 is connected to the bottom board 17 by four fasteners (not shown). The fasteners pass through the mounting holes 143 of the bottom board 17 and are threaded into the lockholes 142 of the locking elements 152. Secondly, the circuit board 13 is mounted to the top cover 11 by another four fasteners (not shown). The another four fasteners pass through the four through holes 137 of the PCB 131 and are threaded into the thread holes 241 of the column posts 24. Thirdly, the data line 136 goes through the sidewall 15 via the second opening 154. Fourthly, the top cover 11 is pressed to the sidewall 15 such that the third portions 263 of the four angle brackets 26 are beneath the annular protrusion 151 and tightly clasped to the annular protrusion 151. Thus, the top cover 11 is rotatably fixed to the sidewall 15 by the four angle brackets 26 and the annular protrusion 151 to make the circuit board 13 received in the housing.

Figure 9:
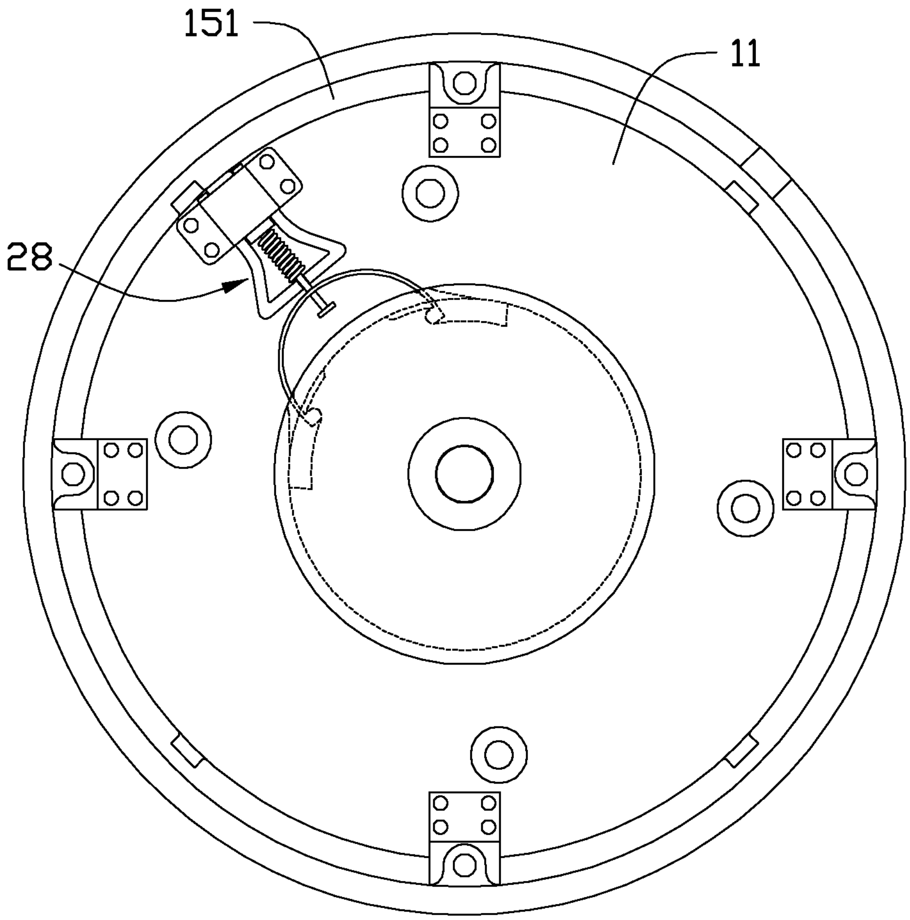
Figure 10:
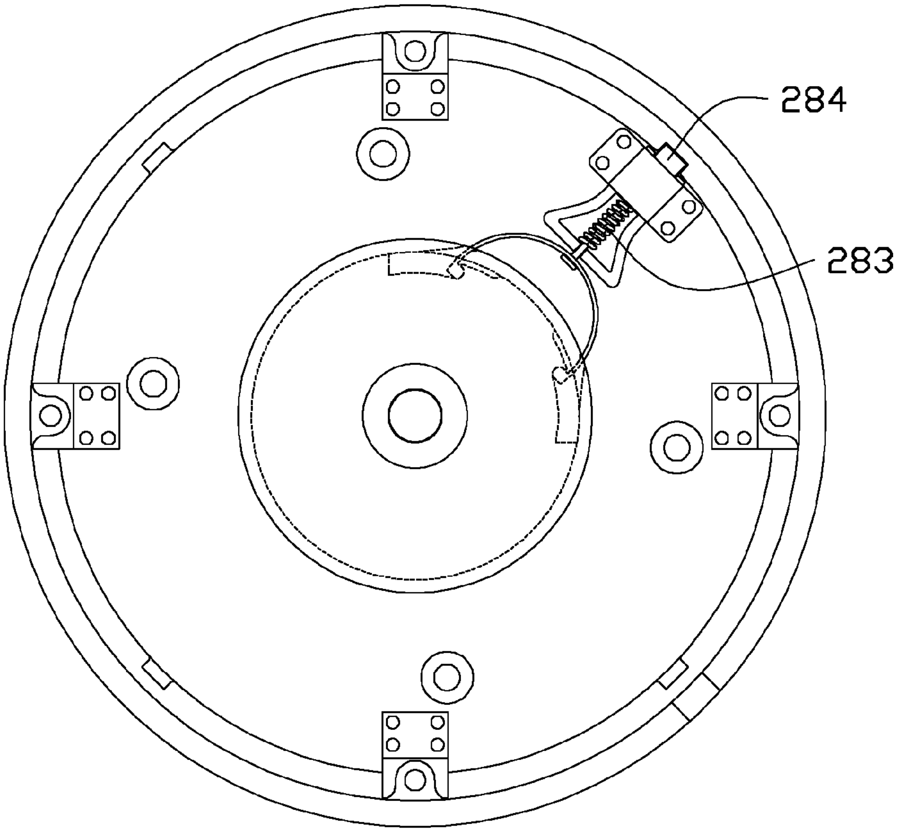

Referring to FIGS. 2 and 7-10, when a user needs to use the RJ-45 interface 134 instead of the VGA interface 135, the user rotates the knob 21 to make the top cover 11 and the circuit board 13 rotate simultaneously. Because the position block 284 is still received in the corresponding recess 156, the transformable element 281 deforms to pull the connecting element 282 and move the connecting element 282. Accordingly, the elastic element 283 becomes short due to a block of the receiving portion 312 of the receiving element 285. Subsequently, the position block 284 of the elastic module 28 is disengaged from the corresponding recess 156 as shown in FIG. 9, and then rotates with the top cover 11 (shown in FIG. 9) along a surface of the protrusion 151. When the label VGA on the top cover 11 is rotated to position above the mark groove 155, the position block 284 of the elastic module 28 receives in the corresponding recess 156, and the elastic element 283 accordingly restores its original state. At this time, the VGA interface 135 is rotated to be exposed by the first opening 153.

The transfer apparatus 100 of the present disclosure includes the elastic module 28 located on the top cover 11 with a preferable flexibility. Accordingly, a friction between the elastic module 28 and the sidewall 15 may be weakened or greatly reduced when the user rotates the top cover 11 to choose a desired interface. Therefore, the lifetime of the transfer apparatus 100 becomes longer.

In alternative embodiments, the number of the interfaces on the circuit board 13 may also be two, three, or even more than four instead.

It is believed that the present embodiments and their advantages will be understood from the foregoing description, and it will be apparent that various changes may be made thereto without departing from the spirit and scope of the present disclosure or sacrificing all of its material advantages, the examples hereinbefore described merely being preferred or exemplary embodiments of the present disclosure.

What is claimed is:

1. A rotatable transfer apparatus, comprising a housing and a circuit board having at least two interfaces, the housing comprising:

a sidewall comprising an opening that exposes one of the at least two interfaces, the sidewall further comprising at least two fasteners defined in an internal surface of the sidewall;

a top cover rotatably mounted on one side of the sidewall adjacent to the fasteners, and comprising a protrusion extending from an inner surface of the top cover;

a bottom board mounted on the other side of the sidewall opposite to the top cover, wherein the sidewall, the bottom board and the top cover define a receiving space for receiving the circuit board; and an elastic module received in the receiving space and fixed to the top cover, and comprising a transformable element, a connecting element, a position block, an elastic element, a receiving element and a position-limiting element;

wherein when the top cover is rotated along the sidewall, the elastic module is disengaged from the said one fastener and rotates with the top cover along the sidewall, the receiving element extends from the inner surface of the top cover and defines a receiving groove, two ends of the transformable element connect to the protrusion, the position block connects to the transformable element via the connecting element with the elastic element sleeved over the connecting element, the position block, the connecting element and the elastic element are received in the receiving groove, the position-limiting element is fixed to the inner surface of the top cover to define a sliding hole, the position block is received in the sliding hole of the position-limiting element and capable of sliding along the receiving groove, and the elastic module is rotated with the top cover and detachably engaged with one of the at least two fasteners of the sidewall to select a desired interface from the at least two interfaces to be exposed to the opening of sidewall.

2. The transfer apparatus of claim 1, wherein the transformable element is arc-shaped and a through hole is defined in the middle of the transformable element, the connecting element comprises a connecting block and a connecting pole extending from the connecting block, the connecting pole passes through the through hole of the transformable element and the elastic element, and connects to the position block, the connecting pole and the connecting block are located at two opposite sides of the transformable element.

3. The transfer apparatus of claim 2, wherein the receiving element comprises a U-shaped structure to defining the receiving groove with an opening towards the sidewall, the U-shaped structure comprises a sliding groove and a gap communicated with the sliding groove, an end of the connecting pole adjacent to the transformable element slides into the sliding groove via the gap.

4. The transfer apparatus of claim 3, wherein the position-limiting element comprises an arch-shaped portion to define the sliding hole.

5. The transfer apparatus of claim 1, further comprising an annular protrusion extending from the internal surface of the sidewall adjacent to the top cover, the at least two fasteners are defined in the annular protrusion.

6. The transfer apparatus of claim 5, wherein the at least two fasteners are recesses.

* * * * *